United States Patent [19]
Peng et al.

[11] Patent Number: 5,897,373
[45] Date of Patent: Apr. 27, 1999

[54] METHOD OF MANUFACTURING SEMICONDUCTOR COMPONENTS HAVING A TITANIUM NITRIDE LAYER

[75] Inventors: Yuan-Ching Peng; Lih-Juann Chen, both of Hsinchu; Wen-Yi Hsieh, Taipei; Jenn-Tarng Lin; Yong-Fen Hsieh, both of Hsinchu, all of Taiwan

[73] Assignee: United Microelectronics Corp., Taiwan

[21] Appl. No.: 08/870,822

[22] Filed: Jun. 6, 1997

[30] Foreign Application Priority Data

Mar. 24, 1997 [TW] Taiwan ................................. 86103717

[51] Int. Cl.⁶ .................................................. H01L 21/283
[52] U.S. Cl. .......................... 438/653; 438/655; 438/656; 438/665; 438/683
[58] Field of Search ..................................... 438/627, 628, 438/630, 643, 644, 648, 649, 653, 654, 655, 656, 665, 682, 683, 685; 257/751, 754, 757, 763, 764

[56] References Cited

U.S. PATENT DOCUMENTS

| | | | |
|---|---|---|---|
| 4,640,004 | 2/1987 | Thomas et al. | 438/632 |
| 4,897,287 | 1/1990 | Berger et al. | 438/655 |
| 5,170,242 | 12/1992 | Stevens et al. | 257/751 |
| 5,322,809 | 6/1994 | Moslehi | 438/303 |
| 5,545,574 | 8/1996 | Chen et al. | 438/297 |

*Primary Examiner*—T. N. Quach
*Attorney, Agent, or Firm*—Finnegan, Henderson, Farabow, Garrett & Dunner, L.L.P.

[57] ABSTRACT

The present invention relates to a method of manufacturing semiconductor components having a titanium nitride layer including the steps of providing a semiconductor substrate with a transistor including a gate and source/drain regions, depositing an insulating layer above the semiconductor substrate, etching the insulating layer to form an opening exposing the source/drain region below, depositing an ultra-thin titanium nitride layer having a grainy particulate profile and a thickness of about 0.5 nm to 2 nm around the edge and at the bottom of the opening, depositing a metallic layer over various aforementioned layers, and forming a metal silicide layer by heating the semiconductor substrate to allow the metallic layer to react with silicon on the semiconductor substrate surface.

12 Claims, 5 Drawing Sheets

METHOD OF MANUFACTURING SEMICONDUCTOR COMPONENTS HAVING A TITANIUM NITRIDE LAYER

BACKGROUND OF THE INVENTION

1. Field of Invention

This invention relates in general to a method of manufacturing semiconductor components having a titanium nitride (TiN) layer, and more particularly to a method of manufacturing a semiconductor component suitable for application in shallow junction and self-aligned suicide processes which can lower the formation temperature of C-54 phase titanium silicide (C-54 TiSi$_2$), and hence increase the stability of components.

2. Description of Related Art

Conventional self-aligned silicide processes are commonly applied to the fabrication of very large scale integration (VLSI) products that have a linewidth of less than about 0.5 m. When the level of integration for semiconductor components is increased, resistance in the source or drain region of a metal-oxide-semiconductor (MOS) component will correspondingly increase until it is comparable with the resistance of the MOS channel. In order to lower the sheet resistance of the source and drain terminals, as well as ensuring the integrity of the shallow junction between a metal layer and the MOS, self-aligned silicide processes or salicide processes are employed.

FIGS. 1A through 1D are a series of cross-sectional views showing the manufacturing steps of a salicide process. First, referring to FIG. 1A, an MOS transistor having a gate 11, source/drain regions 12, and spacers 13 are formed above a silicon substrate 10. A metallic layer 14 with a thickness of about 200 Å to 1000 Å is then deposited on the surface of the silicon substrate 10 through a magnetron DC sputtering method as shown in FIG. 1B. Subsequently, upon application of a high temperature, part of the metallic layer 14 reacts with silicon above the source/drain regions 12 and polysilicon above the gate 11 of the MOS transistor, thereby forming silicide layers 15, as shown in FIG. 1C. The unreacted residual metal remaining after the reactive process is then removed by a wet etching method, thereby leaving behind the metal silicide layers 15 on the top surfaces of the MOS terminals, as shown in FIG. 1D.

Titanium (Ti) is one of the most commonly used materials for the salicide processes. Other materials utilized include cobalt (Co), nickel (Ni), and platinum (Pt). The metal suicide layer formed by a conventional salicide process, such as a titanium silicide layer, has two basic structures, a metastable C-49 phase titanium silicide (C-49 TiSi$_2$) structure, and a thermodynamically more stable C-54 phase titanium silicide (C-54 TiSi$_2$) structure having a lower resistance. C-49 phase titanium silicide has a resistance of between about 60 $\mu\Omega$/cm to 90 $\mu\Omega$/cm and a formation temperature of between about 400° C. to 500° C. C-54 phase titanium silicide has a lower resistance of between about 14 $\mu\Omega$/cm to 16 $\mu\Omega$/cm, but a rather high formation temperature of between about 700° C. to 750° C. In the manufacturing process, generally the higher resistance C-49 phase titanium silicide will be transformed to a lower resistance C-54 phase titanium silicide through the application of a rapid thermal processing (RTP). However, when a VLSI techniques is used for the production of integrated circuits having linewidths of less than about 0.25 m, the formation temperature of C-54 phase titanium silicide will rise to between about 800° C. and 900° C. due to the linewidth size effects. This so-called linewidth size effect is the relationship between the linewidth and the phase transformation temperature. According to this relationship, as the linewidth gets smaller, the transformation temperature necessary for the change from the higher resistance C-49 phase to the lower resistance C-54 phase increases. If the temperature used in RTP is raised to within the formation temperature of a C-54 phase titanium silicide, the titanium silicide layer so formed will have rather unstable properties and may therefore be unsuitable for small dimensional devices. Hence, how to lower the formation temperature for C-54 phase titanium silicide in small dimensional devices has become a major research topic for both academic institutions as well as semiconductor manufacturers.

Conventional methods for lowering the formation temperature of C-54 phase titanium silicide include the interposition of a heat resisting refractory metallic layer such as a molybdenum (Mo) or tungsten (W), or the use of an ion doped amorphous semiconductor substrate formed below the required metal silicide layer. However, the above methods, while still being in the experimental state, will all increase the complexity of the manufacturing process. Therefore, as to date, such methods cannot be directly applied to the fabrication of wafers.

SUMMARY OF THE INVENTION

It is therefore an object of this invention to provide an improved method of manufacturing semiconductor components having a titanium nitride layer which can lower the formation temperature of C-54 phase titanium silicide without increasing the complexity of the manufacturing process.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method of manufacturing semiconductor components having a titanium nitride layer comprising: providing a semiconductor substrate with a transistor including a gate and source/drain regions, depositing an insulating layer above the semiconductor substrate, etching the insulating layer to form an opening exposing the source/drain region, depositing a titanium nitride layer having a grainy particulate profile on the exposed source/drain region, depositing a metallic layer over the substrate, and forming a metal silicon layer by heating the semiconductor to allow the metallic layer to react with silicon on a semiconductor substrate surface, thereby forming a metal silicide layer.

In accordance with another aspect, the present invention comprises a method of manufacturing semiconductor components having a titanium nitride layer comprising: providing a semiconductor substrate, forming a titanium nitride layer having a grainy particulate profile above the semiconductor substrate, covering the substrate and titanium nitride layer with a metallic layer, and forming a metal suicide layer by heating the substrate to allow the metal in the metallic layer to react with silicon in the semiconductor substrate.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principals of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
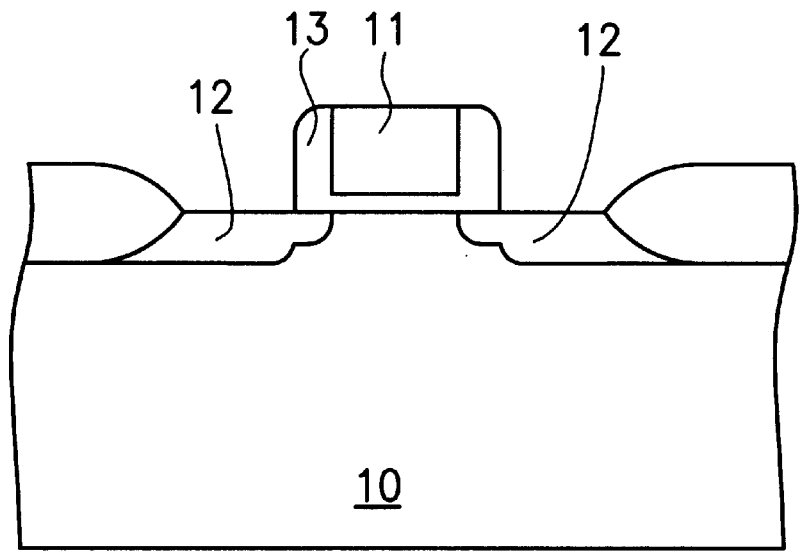
FIGS. 1A through 1D are a series of cross-sectional views showing the conventional manufacturing steps for forming a salicide layer.
Figure 1B:
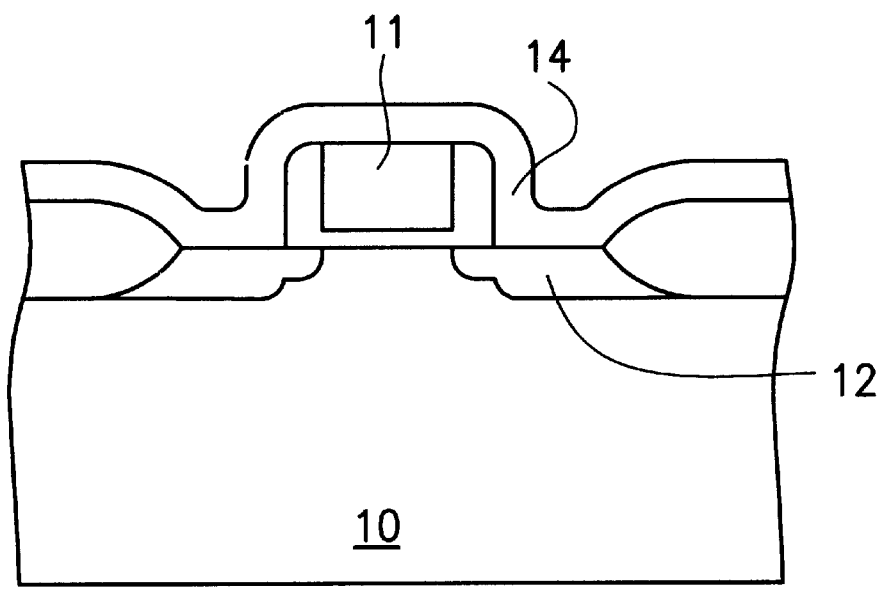
Figure 1C:
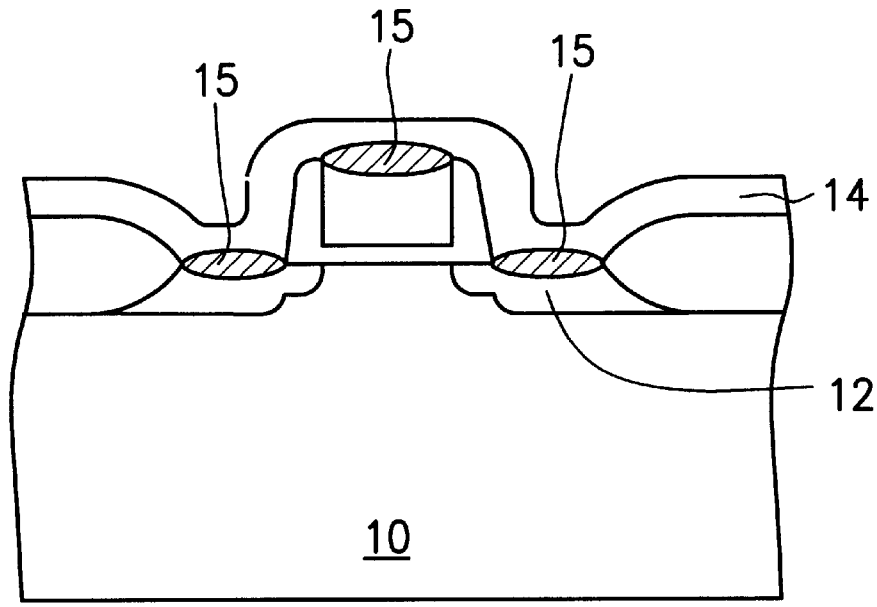
Figure 1D:
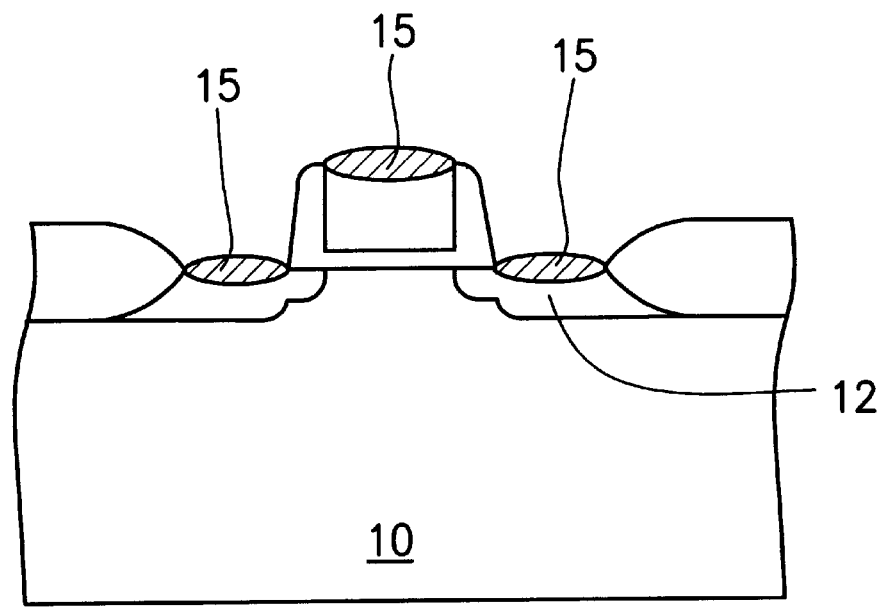
Figure 2A:
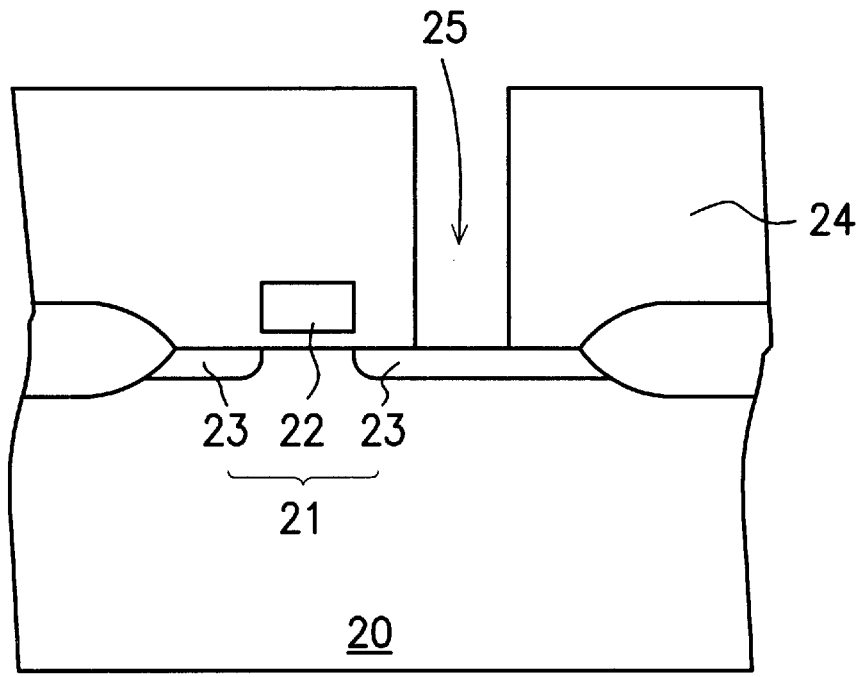
FIG. 2A through 2D are a series of cross-sectional views showing the manufacturing steps for semiconductor components having a titanium nitride layer according to a first preferred embodiment of this invention.

FIG. 2A through 2D are a series of cross-sectional views of a first preferred embodiment of this invention showing the steps for manufacturing semiconductor components having a titanium nitride layer. Referring to FIG. 2A, a semiconductor substrate 20 is provided with a transistor 21 which consists of a gate 22 and two source/drain regions 23. The semiconductor substrate 20 can be a silicon substrate, a polysilicon substrate or amorphous substrate formed by bombarding a silicon substrate with a high energy ion beam. Thereafter, a chemical vapor deposition (CVD) method is used to deposit an insulating layer 24 above the semiconductor substrate 20. Then, the insulating layer 24 is etched forming an opening 25, thereby exposing one of the source/drain regions. The opening 25 is used as a metal plug in later stage.

Figure 2B:
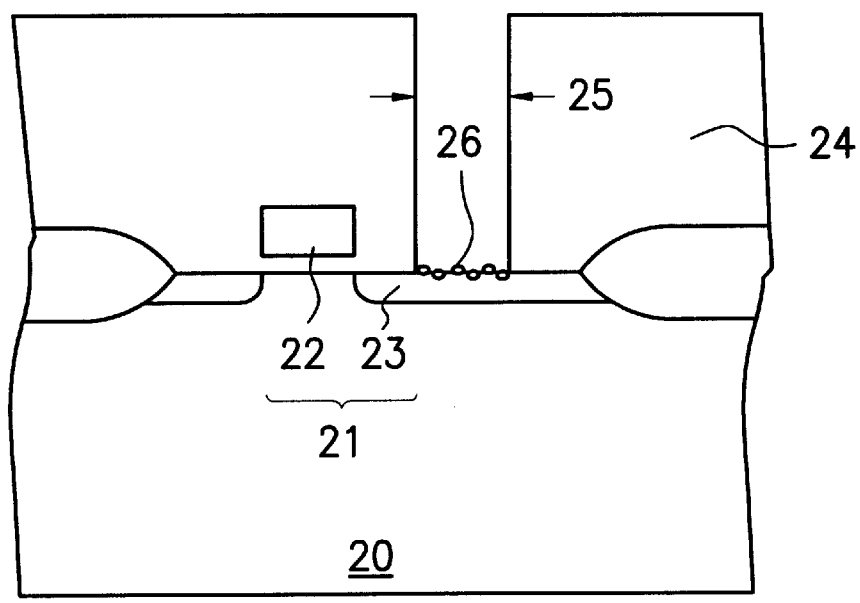

Referring next to FIG. 2B, in the subsequent step a thin titanium nitride layer 26 is deposited above the insulating layer 24 and exposed source/drain region 23 using a physical vapor deposition (PVD) method such as magnetron DC sputtering. The resulting titanium nitride layer 26 is ultra-thin with a thickness of between about 0.5 nm to 2 nm, and an approximately grainy particulate profile which is discontinuously distributed. Owing to the relatively large depth in the opening 25, during the deposition of a titanium nitride layer 26 in the source/drain region 23, the deposition rate is so moderate as to create an appearance that the reactants are showering down in particles, thereby producing a grainy particulate titanium nitride layer 26. The titanium nitride layer 26 is formed with a grainy particulate structure to increase nucleation sites, thereby generating more grain boundaries and raising the surface-to-volume ratio in preparation for the subsequent formation of the C-49 phase titanium silicide layer 27.

Figure 2C:
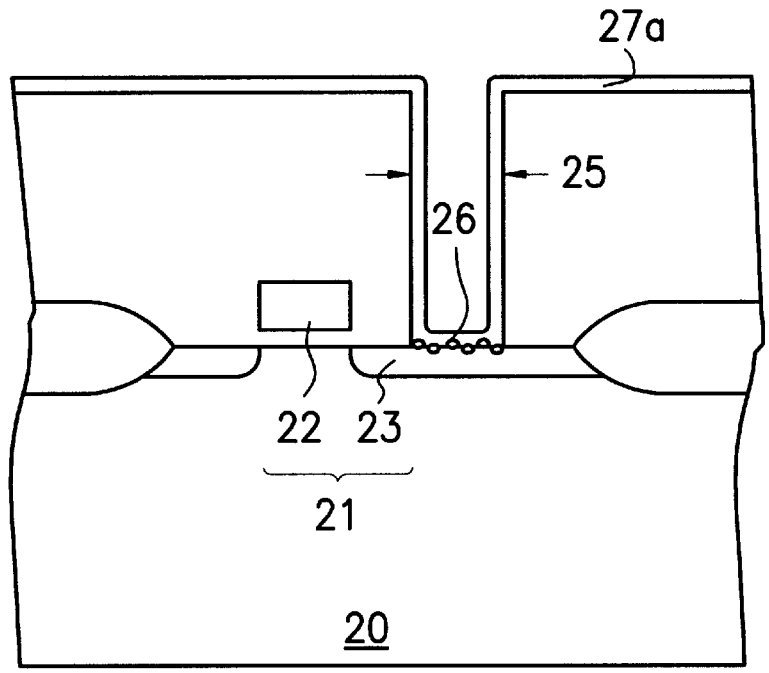

Referring next to FIG. 2C, a metallic layer 27a, such as a titanium layer, is deposited over the various layers using a physical vapor deposition method.

Figure 2D:
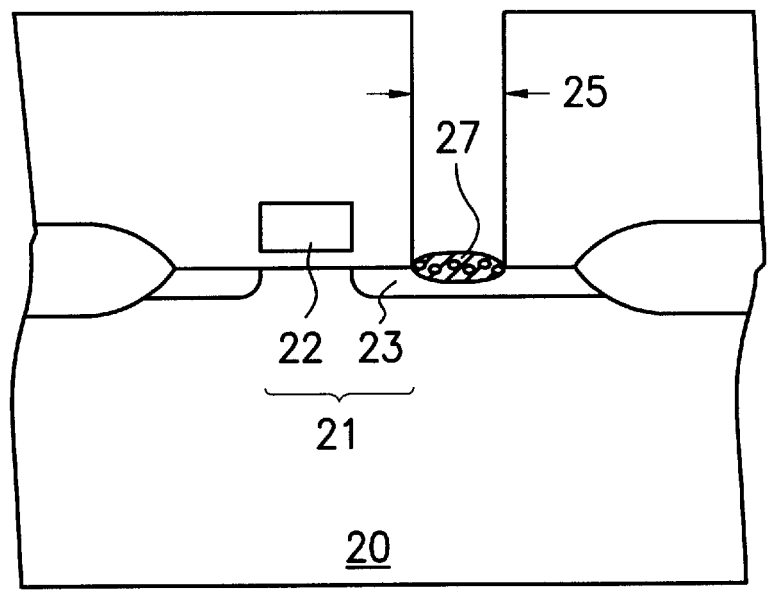

Referring next to FIG. 2D, heat is applied, for example, with a temperature of between about 400° C. to 500° C., to allow the titanium in the metallic layer 27a to react with the silicon above the source/drain region 23 to thereby form the titanium silicide layer 27. At this point, the titanium silicide layer 27 formed is still a C-49 phase titanium silicide having a high resistance. Next, a rapid thermal processing (RTP) method is used to transform the C-49 phase titanium silicide into a lower resistance C-54 phase titanium silicide. During the heating operation C-54 phase titanium silicide begins to grow on the grain boundaries of either the titanium nitride layer 26 or the C-49 phase titanium silicide layer 27, with the grain boundaries facilitating the transformation. Finally, the unreacted residual metallic layer 27a is removed. The titanium silicide layer 27 mainly serves as an adjusting element in lowering the sheet resistance of the source/drain region 23 while ensuring the integrity of the shallow junction between subsequently deposited metallic layers in the opening 25 and the source/drain region 23. Based upon the linewidth size effects produced by the conventional methods, the conventional RTP method requires a rise in temperature to between approximately 800° C. to 900° C. for the formation of C-54 phase titanium silicide. However, with the interposition of a titanium nitride layer 26 according the instant invention, the temperature required for the RTP method to form the C-54 phase titanium silicide can be maintained at between approximately 700° C to 800° C., a lowering of the formation temperature by about 100° C.

Figure 3:
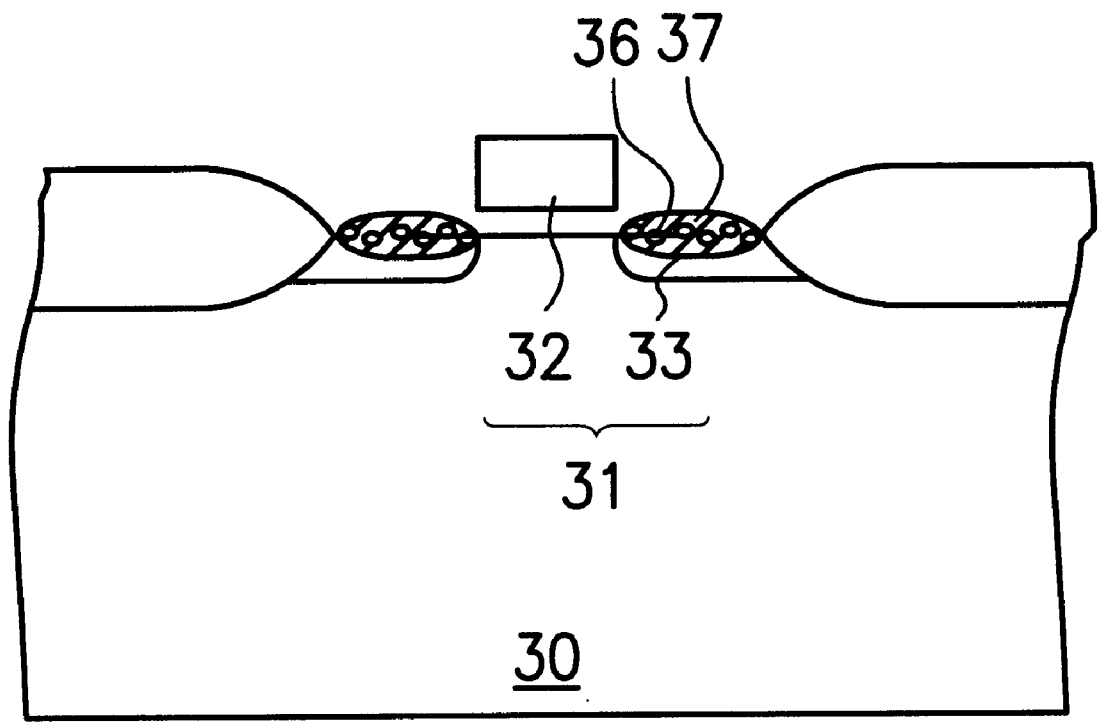
FIG. 3 is a cross-sectional view showing a semiconductor component having a titanium nitride layer according to a second preferred embodiment of this invention.

FIG. 3 is a cross-sectional view showing a semiconductor component having a titanium nitride layer according to a second preferred embodiment of this invention. First, a semiconductor substrate 30 is provided with a transistor 31 which consists of a gate 32 and source/drain regions 33. An ultra-thin layer of titanium nitride 36 with a thickness of between about 0.5 nm to 2 nm is then deposited above the source/drain regions 33 using a physical vapor deposition method. The deposited titanium nitride layer 36 defines a grainy particulate profile which is discontinuously distributed. Next, a metallic layer 37a, such as a titanium layer, is deposited on the metallic layer 37a using a physical vapor deposition method. Thereafter, a high temperature, such as between about 400° C. to 500° C., is applied to allow the titanium in the metallic layer 37a react with the silicon above the source/drain regions 33, to thereby form a titanium silicide layer 37. At this point, the titanium silicide layer 37 formed is still in the C-49 phase which has a high resistance. Subsequently, an RTP method, for example between approximately 700° C. and 800° C., is used to transform the C-49 phase titanium silicide into a C-54 phase titanium silicide having a lower resistance. Finally, the unreacted residual metallic layer 37a is removed. Owing to the linewidth size effects in a conventional manufacturing method, the conventional RTP method requires a rise in temperature to between approximately 800° C. to 900° C. However, with the deposit of a titanium nitride layer 36 as stipulated in the instant invention, the RTP method temperature can remain at between about 700° C. to 800° C., a lowering of the formation temperature by about 100° C.

A summary of the advantages of the present invention are as follows:

(1) The grainy particulate profile for the imposed titanium nitride layer 26 produces increased nucleation sites, generating more grain boundaries for subsequent C-49 phase titanium silicide layer 27 formation. After the application of heat, C-54 phase titanium silicide will form about the grain boundaries of the titanium nitride layer 26 or the C-49 phase titanium suicide layer 27. The increased grain boundaries facilitate the transformation from C-49 phase titanium silicide into C-54 phase titanium silicide, thereby lowering the formation temperature of C-54 phase titanium silicide by about 100° C.

(2) The titanium nitride layer 26 and titanium silicide 27 layer are both formed by a physical vapor deposition method through the application of heat. Therefore, the formation of these layers can take place in the same PVD chamber, thereby reducing manufacturing effort and expense.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing semiconductor components having a titanium nitride layer comprising:

providing a semiconductor substrate with a transistor including a gate and source/drain regions;

depositing an insulating layer above the semiconductor substrate;

etching the insulating layer to form an opening exposing the source/drain region;

depositing a titanium nitride layer having a grainy particulate profile on the exposed source/drain region;

depositing a metallic layer over the substrate; and forming a metal silicide layer by heating the semiconductor to allow the metallic layer to react with silicon on a semiconductor substrate surface.

2. A method of manufacturing according to claim 1, wherein the semiconductor substrate includes a silicon substrate.

3. A method of manufacturing according to claim 1, wherein the semiconductor substrate includes a polysilicon substrate.

4. A method of manufacturing according to claim 1, wherein the semiconductor substrate includes amorphous silicon formed by bombarding a silicon substrate with a high energy ion beam.

5. A method of manufacturing according to claim 1, wherein the thickness of the titanium nitride layer is between about 0.5 nm to 2 nm.

6. A method of manufacturing according to claim 1, wherein the titanium nitride layer is formed by a physical vapor deposition method.

7. A method of manufacturing according to claim 1, wherein the metallic layer is formed by a physical vapor deposition method.

8. A method of manufacturing according to claim 1, wherein the metallic layer includes titanium.

9. A method of manufacturing according to claim 1, wherein the heat is applied through a rapid thermal processing method.

10. A method of manufacturing according to claim 1, wherein the metal silicide layer includes titanium.

11. A method of manufacturing semiconductor components having a titanium nitride layer comprising:

providing a semiconductor substrate;

forming a titanium nitride layer having a grainy particulate profile above the semiconductor substrate;

covering the substrate and titanium nitride layer with a metallic layer; and forming a metal silicide layer by heating the substrate to allow the metal in the metallic layer to react with silicon in the semiconductor substrate.

12. A method of manufacturing according to claim 11, wherein the thickness of the titanium nitride layer is between about 0.5 nm to 2 nm.

* * * * *